United States Patent
Uchida

(10) Patent No.: US 10,620,400 B2
(45) Date of Patent: Apr. 14, 2020

(54) POSITION DETECTION DEVICE FOR MOVABLE LENS, LENS DEVICE, IMAGING DEVICE, POSITION DETECTION METHOD FOR MOVABLE LENS, AND NON-TRANSITORY COMPUTER READABLE MEDIUM STORING A POSITION DETECTION PROGRAM FOR MOVABLE LENS

(71) Applicant: FUJIFILM Corporation, Tokyo (JP)

(72) Inventor: Keisuke Uchida, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 183 days.

(21) Appl. No.: 15/939,302

(22) Filed: Mar. 29, 2018

(65) Prior Publication Data

US 2018/0217355 A1    Aug. 2, 2018

Related U.S. Application Data

(63) Continuation of application No. PCT/JP2016/067786, filed on Jun. 15, 2016.

(30) Foreign Application Priority Data

Sep. 30, 2015 (JP) ................... 2015-194233

(51) Int. Cl.
   *G02B 7/02* (2006.01)
   *G02B 7/10* (2006.01)
   (Continued)

(52) U.S. Cl.
   CPC ............ *G02B 7/102* (2013.01); *G01D 5/145* (2013.01); *G01D 5/24461* (2013.01); *G02B 7/08* (2013.01);
   (Continued)

(58) Field of Classification Search
   CPC . G02B 7/08; G02B 7/10; G02B 7/026; G02B 7/04; G02B 7/09; G03B 5/02;
   (Continued)

(56) References Cited

U.S. PATENT DOCUMENTS

2004/0037547 A1    2/2004   Okawara
2007/0291424 A1   12/2007   Nishimoto et al.
(Continued)

FOREIGN PATENT DOCUMENTS

CN    104541133    4/2015
CN    104704327    6/2015
(Continued)

OTHER PUBLICATIONS

"International Search Report (Form PCT/ISA/210) of PCT/JP2016/067786," dated Sep. 13, 2016, with English translation thereof, pp. 1-5.
"Written Opinion of the International Searching Authority (Form PCT/ISA/237) of PCT/JP2016/067786," dated Sep. 13, 2016, with English translation thereof, pp. 1-11.
"Office Action of China Counterpart Application," with machine English translation thereof, dated Sep. 3, 2019, p. 1-p. 12.

*Primary Examiner* — Mahidere S Sahle
(74) *Attorney, Agent, or Firm* — JCIPRNET

(57) ABSTRACT

A position detection device for a movable lens includes: a first position detection unit as defined herein; a storage control unit as defined herein; a second position detection unit as defined herein; an output unit as defined herein; and a second sensor-state detection unit as defined herein, and the first position detection unit detects the first position based on a signal output from the first sensor at a timing determined in advance, and detects the first position again based on a signal output from the first sensor in an abnormality-recovery state in which the second sensor-state detection unit detects that the output signal of the second sensor is in the abnormal state and then detects that the output signal of the second sensor is in the normal state after the first position is stored in the storage unit.

31 Claims, 6 Drawing Sheets

(51) Int. Cl.
*G02B 7/08* (2006.01)
*G01D 5/14* (2006.01)
*G01D 5/244* (2006.01)
*H04N 5/232* (2006.01)
*G02B 15/14* (2006.01)

(52) U.S. Cl.
CPC ............. *G02B 15/14* (2013.01); *H04N 5/232* (2013.01); *H04N 5/23212* (2013.01); *H04N 5/23296* (2013.01)

(58) Field of Classification Search
CPC .................... G03B 13/34; G03B 13/36; G03B 2205/0046; G03B 2205/0053
USPC .................................. 359/694–706, 822–826
See application file for complete search history.

(56) References Cited

U.S. PATENT DOCUMENTS

| | | |
|---|---|---|
| 2015/0160427 A1 | 6/2015 | Miyashita |
| 2015/0163388 A1 | 6/2015 | Miyashita |
| 2017/0003475 A1 | 1/2017 | Miyashita |

FOREIGN PATENT DOCUMENTS

| | | |
|---|---|---|
| JP | 2004085684 | 3/2004 |
| JP | 2007322197 | 12/2007 |
| JP | 2009210389 | 9/2009 |
| JP | 2009300222 | 12/2009 |
| JP | 2011138007 | 7/2011 |
| WO | 2015141053 | 9/2015 |

POSITION DETECTION DEVICE FOR MOVABLE LENS, LENS DEVICE, IMAGING DEVICE, POSITION DETECTION METHOD FOR MOVABLE LENS, AND NON-TRANSITORY COMPUTER READABLE MEDIUM STORING A POSITION DETECTION PROGRAM FOR MOVABLE LENS

CROSS REFERENCE TO RELATED APPLICATION

This is a continuation of International Application No. PCT/JP2016/067786 filed on Jun. 15, 2016, and claims priority from Japanese Patent Application No. 2015-194233 filed on Sep. 30, 2015, the entire disclosures of which are incorporated herein by reference.

BACKGROUND OF THE INVENTION

1. Field of the Invention

The present invention relates to a position detection device for a movable lens, a lens device, an imaging device, a position detection method for a movable lens, and a computer readable medium storing a position detection program for a movable lens.

2. Description of the Related Art

In recent years, a television, a monitor, and the like have increased in screen size and resolution and a demand for high quality of videos shown in the television, the monitor, and the like has increased.

In response to the demand for high quality, a position detection device, which can highly accurately detect the position of a movable lens, such as a zoom lens or a focus lens, is mounted on a lens device for a movie, broadcasting, or the like to improve the performance of the control of the lens.

As the position detection device, there is a position detection device that directly detects the position of a movable lens in the direction of an optical axis by a Hall element, a variable resistor, or the like.

Further, there is a position detection device for detecting the position of a movable lens by a combination of an absolute position detection sensor, such as a Hall element or a variable resistor, which directly detects the position of the movable lens in the direction of an optical axis, and a relative position detection sensor that detects the position of the movable lens in the direction of the optical axis relative to the position detected by the absolute position detection sensor.

As the relative position detection sensor, there are a sensor that includes a magnetoresistive element of which the resistance value changes according to the presence/absence of a magnetic field, an angular displacement sensor that is disclosed in JP2009-300222A, and the like.

JP2009-300222A discloses an abnormality detection device that determines whether or not the abnormality of an angular displacement sensor is present on the basis of a sine wave signal and a cosine wave signal output from an angular displacement sensor.

SUMMARY OF THE INVENTION

In a state in which the output of a relative position detection sensor becomes unstable due to the application of a strong electric field to the relative position detection sensor from the outside of the device in a case in which the relative position detection sensor is used for the detection of the position of a movable lens of a lens device, the accuracy of detection of the movable lens deteriorates.

A technique for detecting that the output of a sensor used for the detection of the position or the like of an object deviates from a desired state is known as disclosed in JP2009-300222A. However, the detection of the fact that the output of the relative position detection sensor is not in a desired state is not enough in the lens device.

For example, in a case in which the output of a relative position detection sensor used for the detection of the position of a zoom lens is not in a desired state, the position of the zoom lens becomes inaccurate at that point of time. Even though the output of the relative position detection sensor returns to a desired state thereafter, the position of the zoom lens is still inaccurate. For this reason, intended imaging cannot be performed.

Likewise, when the output of a relative position detection sensor used for the detection of the position of a focus lens is not in a desired state, the position of the focus lens becomes inaccurate at that point of time. Even though the output of the relative position detection sensor returns to a desired state thereafter, the position of the focus lens is still inaccurate. For this reason, it is difficult to take a video that is in focus.

The invention has been made in consideration of the above-mentioned circumstances, and an object of the invention is to provide a position detection device for a movable lens that can accurately detect the position of a movable lens and continue to perform good imaging work even in a case in which an output of a sensor to be used for the detection of the position of the movable lens significantly deviates from a desired state, a lens device including the position detection device, an imaging device including the position detection device, a position detection method for a movable lens, and a computer readable medium storing a position detection program for a movable lens.

A position detection device for a movable lens of the invention comprises a first position detection unit that detects a first position of a movable lens in a direction of an optical axis on the basis of a signal output from a first sensor outputting a signal corresponding to the position of the movable lens in the direction of the optical axis, a storage control unit that stores the first position detected by the first position detection unit in a storage unit, a second position detection unit that detects a second position of the movable lens in the direction of the optical axis on the basis of a signal output from a second sensor outputting a signal corresponding to a moving distance of the movable lens in the direction of the optical axis and the most recent first position stored in the storage unit, an output unit that outputs the second position detected by the second position detection unit, and a second sensor-state detection unit that detects whether the output signal of the second sensor is in a normal state or an abnormal state. The first position detection unit detects the first position on the basis of a signal output from the first sensor at a timing determined in advance, and detects the first position again on the basis of a signal output from the first sensor in an abnormality-recovery state in which the second sensor-state detection unit detects that the output signal of the second sensor is in the abnormal state and then detects that the output signal of the second sensor is in the normal state after the first position is stored in the storage unit.

A lens device of the invention comprises the position detection device and a movable lens of which the position is to be detected by the position detection device.

An imaging device of the invention comprises the position detection device and an imaging element that images a subject through a movable lens of which the position is to be detected by the position detection device.

A position detection method for a movable lens of the invention comprises a first position detection step of detecting a first position of a movable lens in a direction of an optical axis on the basis of a signal output from a first sensor outputting a signal corresponding to the position of the movable lens in the direction of the optical axis, a storage control step of storing the first position detected in the first position detection step in a storage unit, a second position detection step of detecting a second position of the movable lens in the direction of the optical axis on the basis of a signal output from a second sensor outputting a signal corresponding to a moving distance of the movable lens in the direction of the optical axis and the most recent first position stored in the storage unit, an output step of outputting the second position detected in the second position detection step, and a second sensor-state detection step of detecting whether the output signal of the second sensor is in a normal state or an abnormal state. In the first position detection step, the first position is detected on the basis of a signal output from the first sensor at a timing determined in advance, and the first position is detected again on the basis of a signal output from the first sensor in an abnormality-recovery state in which in the second sensor-state detection step, it is detected that the output signal of the second sensor is in the abnormal state and it is then detected that the output signal of the second sensor is in the normal state after the first position is stored in the storage unit.

A position detection program for a movable lens of the invention allows a computer to execute a first position detection step of detecting a first position of a movable lens in a direction of an optical axis on the basis of a signal output from a first sensor outputting a signal corresponding to the position of the movable lens in the direction of the optical axis, a storage control step of storing the first position detected in the first position detection step in a storage unit, a second position detection step of detecting a second position of the movable lens in the direction of the optical axis on the basis of a signal output from a second sensor outputting a signal corresponding to a moving distance of the movable lens in the direction of the optical axis and the most recent first position stored in the storage unit, an output step of outputting the second position detected in the second position detection step, and a second sensor-state detection step of detecting whether the output signal of the second sensor is in a normal state or an abnormal state. In the first position detection step, the first position is detected on the basis of a signal output from the first sensor at a timing determined in advance, and the first position is detected again on the basis of a signal output from the first sensor in an abnormality-recovery state in which in the second sensor-state detection step, it is detected that the output signal of the second sensor is in the abnormal state and it is then detected that the output signal of the second sensor is in the normal state after the first position is stored in the storage unit.

According to the invention, it is possible to provide a position detection device for a movable lens that can accurately detect the position of a movable lens and continue to perform good imaging work even in a case in which an output of a sensor to be used for the detection of the position of the movable lens significantly deviates from a desired state, a lens device including the position detection device, an imaging device including the position detection device, a position detection method for a movable lens, and a position detection program for a movable lens.

DESCRIPTION OF THE PREFERRED EMBODIMENTS

Embodiments of the invention will be described below with reference to the drawings.

Figure 1:
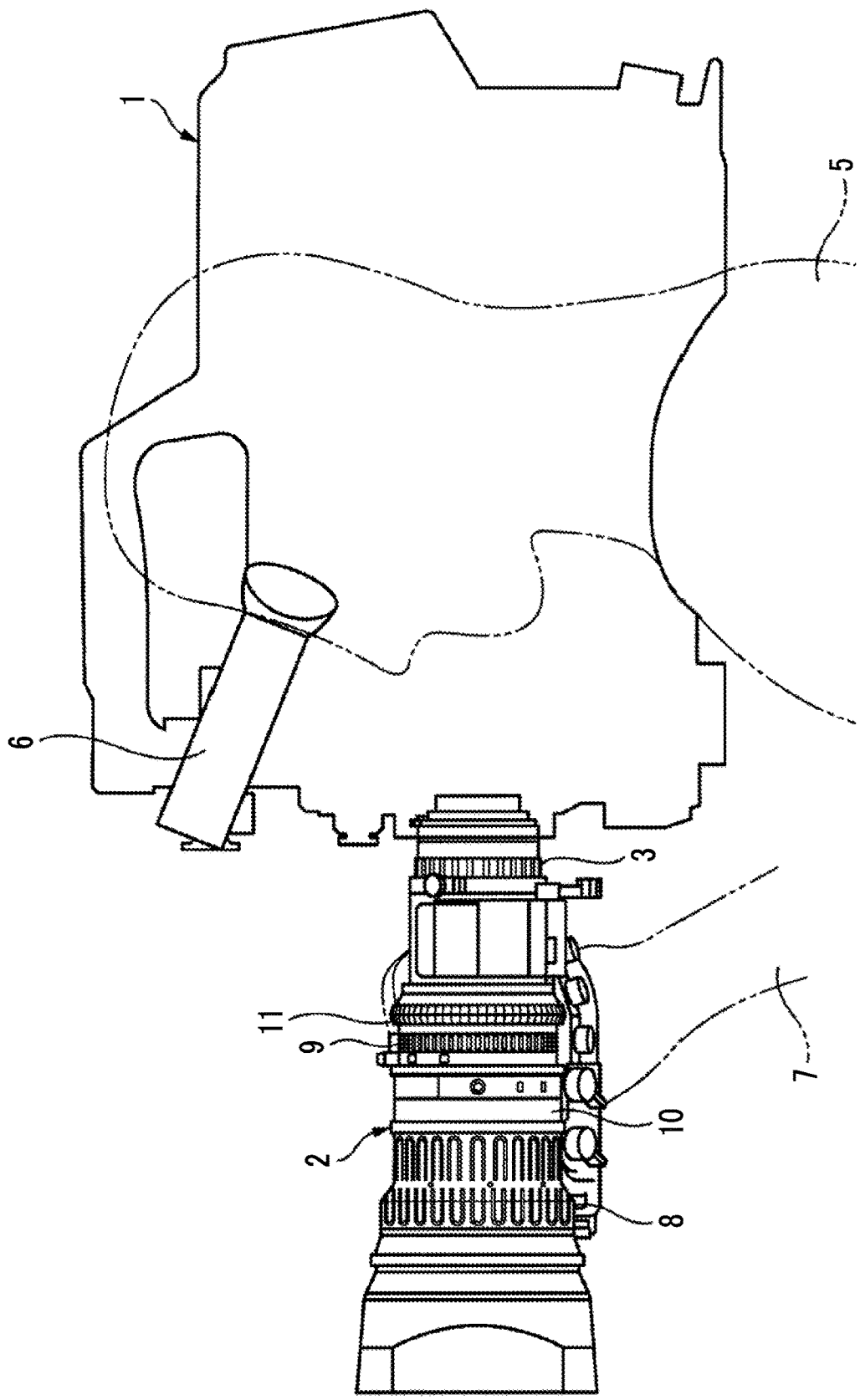
FIG. 1 is an external view showing the schematic structure of an imaging system according to an embodiment of the invention.

FIG. 1 is an external view showing the schematic structure of an imaging system according to an embodiment of the invention. The imaging system shown in FIG. 1 includes an imaging device 1 and a lens device 2 that is mounted on the imaging device 1.

The lens device 2 includes a housing 10 having a tubular shape, such as a cylindrical shape. Imaging lenses that include a zoom lens and a focus lens and a diaphragm device that can adjust an aperture are built in the housing 10.

A mount portion 3 is provided on the base portion of the housing 10 of the lens device 2. A connection portion of the mount portion 3 is mounted on a lens mounting portion provided on the front portion of the imaging device 1, so that the lens device 2 is fixed to the imaging device 1.

An imaging element is disposed on the optical axis of the lens device 2 in a state in which the lens device 2 is mounted on the imaging device 1. Further, a subject is imaged through the imaging lenses of the lens device 2 by the imaging element. Output signals of the imaging element are processed by an image processing unit built in the imaging device 1, so that various image data are generated.

A photographer 5 carries the imaging device 1 on one's right shoulder and looks in a finder device 6 with, for example, a right eye. Further, while the photographer 5 grips a grip portion of the lens device 2 with a right hand 7 to fix the imaging device, the photographer 5 images a subject.

A focus ring 8, which adjusts the focal position of the focus lens, is provided on the distal end side (subject side) of the lens device 2 so as to be rotationally movable around the outer periphery of the housing 10. In a case in which the photographer 5 rotates the focus ring 8 by an arbitrary angle with a hand, the photographer 5 can adjust a focus position.

A zoom ring 9, which adjusts the zoom position of the zoom lens, is provided at the middle portion of the lens device 2 so as to be rotationally movable around the outer periphery of the housing 10. In a case in which the photographer 5 rotates the zoom ring 9 by an arbitrary angle with a hand, the photographer 5 can adjust zoom magnification.

The lens device 2 is provided with an iris ring 11, which is used to adjust the aperture of the diaphragm device, on the side of the zoom ring 9 close to the imaging device 1. The iris ring 11 is provided so as to be rotationally movable around the outer periphery of the lens device 2.

Figure 2:
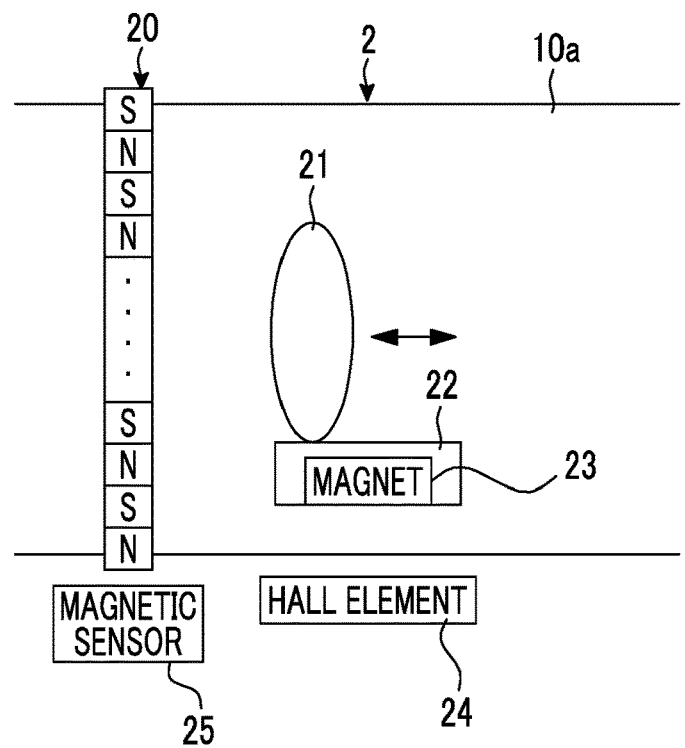
FIG. 2 is a schematic diagram showing the internal configuration of a housing 10 of a lens device 2 shown in FIG. 1 near a zoom ring 9.

FIG. 2 is a schematic diagram showing the internal configuration of the housing 10 of the lens device 2 shown in FIG. 1 near the zoom ring 9.

A rotating cylinder 10a that is rotatable about an optical axis of the lens device 2, a zoom lens 21 serving as a movable lens that is provided in the rotating cylinder 10a and is movable in the direction of the optical axis, and a zoom lens holder 22 that holds the zoom lens 21 are provided in the housing 10 that is provided with the zoom ring 9 on the outer periphery thereof.

The rotating cylinder 10a includes a cam groove (not shown) that is used to convert the rotational motion of the rotating cylinder 10a into the linear motion of the zoom lens holder 22. A part of the zoom lens holder 22 is movably engaged with the cam groove. Accordingly, in a case in which the zoom ring 9 is operated and the zoom lens holder 22 is moved in the direction of the optical axis, the rotating cylinder 10a is rotated about the optical axis with the movement of the zoom lens holder 22.

A magnet 23 is fixed to the zoom lens holder 22. A Hall element 24, which coverts a magnetic field formed using Hall effect by the magnet 23 into electrical signals, is fixed outside the rotating cylinder 10a in the housing 10.

Since the magnet 23 is fixed to the zoom lens 21, signals output from the Hall element 24 are signals corresponding to the position of the zoom lens 21.

The Hall element 24 forms a first sensor that outputs a signal corresponding to the position of the zoom lens 21. A variable resistor, a potentiometer, and the like other than the Hall element 24 can also be used as the first sensor.

An annular magnetic recording member 20, which extends along the rotational direction of the rotating cylinder 10a, is fixed to the outer periphery of the rotating cylinder 10a. The magnetic recording member 20 is a member in which magnets having an S pole and an N pole are alternately magnetized along the rotational direction of the rotating cylinder 10a.

A magnetic sensor 25 is fixed and disposed outside the rotating cylinder 10a at a position facing the magnetic recording member 20 in the housing 10.

The magnetic sensor 25 includes two magnetoresistive elements of which electric resistance is changed according to an applied magnetic field. The magnetic sensor 25 detects the magnetic signal of the magnetic recording member 20, and outputs a sine wave signal and a cosine wave signal of which the phase is shifted from the phase of the sine wave signal by 90°.

The magnetic recording member 20 is fixed to the rotating cylinder 10a, and the rotation angle of the rotating cylinder 10a corresponds to the moving distance of the zoom lens 21 in the direction of the optical axis. For this reason, the sine wave signals and the cosine wave signals, which are output from the magnetic sensor 25, are signals corresponding to the moving distance of the zoom lens 21 in the direction of the optical axis.

The magnetic sensor 25 forms a second sensor that outputs a signal corresponding to the moving distance of the zoom lens 21 in the direction of the optical axis in this way. The second sensor only has to be capable of detecting the moving distance of the zoom lens 21 in the direction of the optical axis, and a sensor other than the magnetic sensor may also be used as the second sensor.

Figure 3:
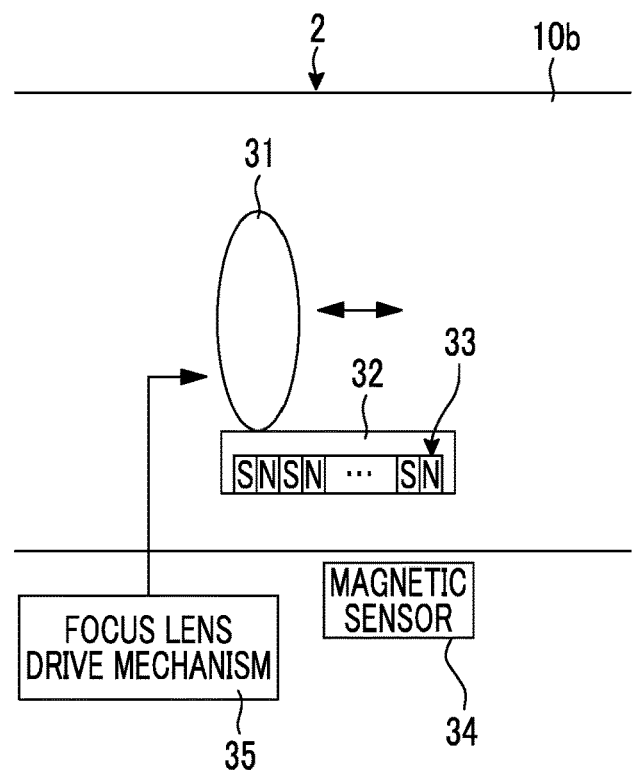
FIG. 3 is a schematic diagram showing the internal configuration of the housing 10 of the lens device 2 shown in FIG. 1 near a focus ring 8.

FIG. 3 is a schematic diagram showing the internal configuration of the housing 10 of the lens device 2 shown in FIG. 1 near the focus ring 8.

A rotating cylinder 10b that is rotatable about the optical axis of the lens device 2, a focus lens 31 serving as a movable lens that is provided in the rotating cylinder 10b and is movable in the direction of the optical axis, and a focus lens holder 32 that holds the focus lens 31 are provided in the housing 10 that is provided with the focus ring 8 on the outer periphery thereof.

The rotating cylinder 10b is rotated in synchronization with the rotation of the focus ring 8. The rotating cylinder 10b includes a cam groove (not shown) that is used to convert the rotational motion of the rotating cylinder 10b into the linear motion of the focus lens holder 32. A part of the focus lens holder 32 is movably engaged with the cam groove.

Accordingly, in a case in which the focus ring 8 is rotated, the rotating cylinder 10b is rotated and the focus lens 31 is moved in the direction of the optical axis.

A linear magnetic recording member 33, which extends along the moving direction of the focus lens 31, is fixed to the focus lens holder 32. The magnetic recording member 33 is a member in which magnets having an S pole and an N pole are alternately magnetized along the moving direction of the focus lens 31.

A magnetic sensor 34 is fixed and disposed outside the rotating cylinder 10b at a position facing the magnetic recording member 33 in the housing 10. The magnetic sensor 34 includes two magnetoresistive elements of which electric resistance is changed according to an applied magnetic field. The magnetic sensor 34 detects a magnetic signal from the magnetic recording member 33, and outputs a sine wave signal and a cosine wave signal of which the phase is shifted from the phase of the sine wave signal by 90°.

The magnetic recording member 33 is fixed to the focus lens 31. For this reason, the sine wave signals and the cosine wave signals, which are output from the magnetic sensor 34, are signals corresponding to the moving distance of the focus lens 31 in the direction of the optical axis.

The magnetic sensor 34 forms a third sensor that outputs a signal corresponding to the moving distance of the focus lens 31 in the direction of the optical axis in this way. The third sensor only has to be capable of detecting the moving distance of the focus lens 31 in the direction of the optical axis, and a sensor other than the magnetic sensor may also be used as the third sensor.

A focus lens drive mechanism 35, which is used to drive the focus lens 31, is provided in the housing 10. The focus lens drive mechanism 35 controls the position of the focus lens 31 in accordance with an instruction that is output from a position detection device to be described below.

Figure 4:
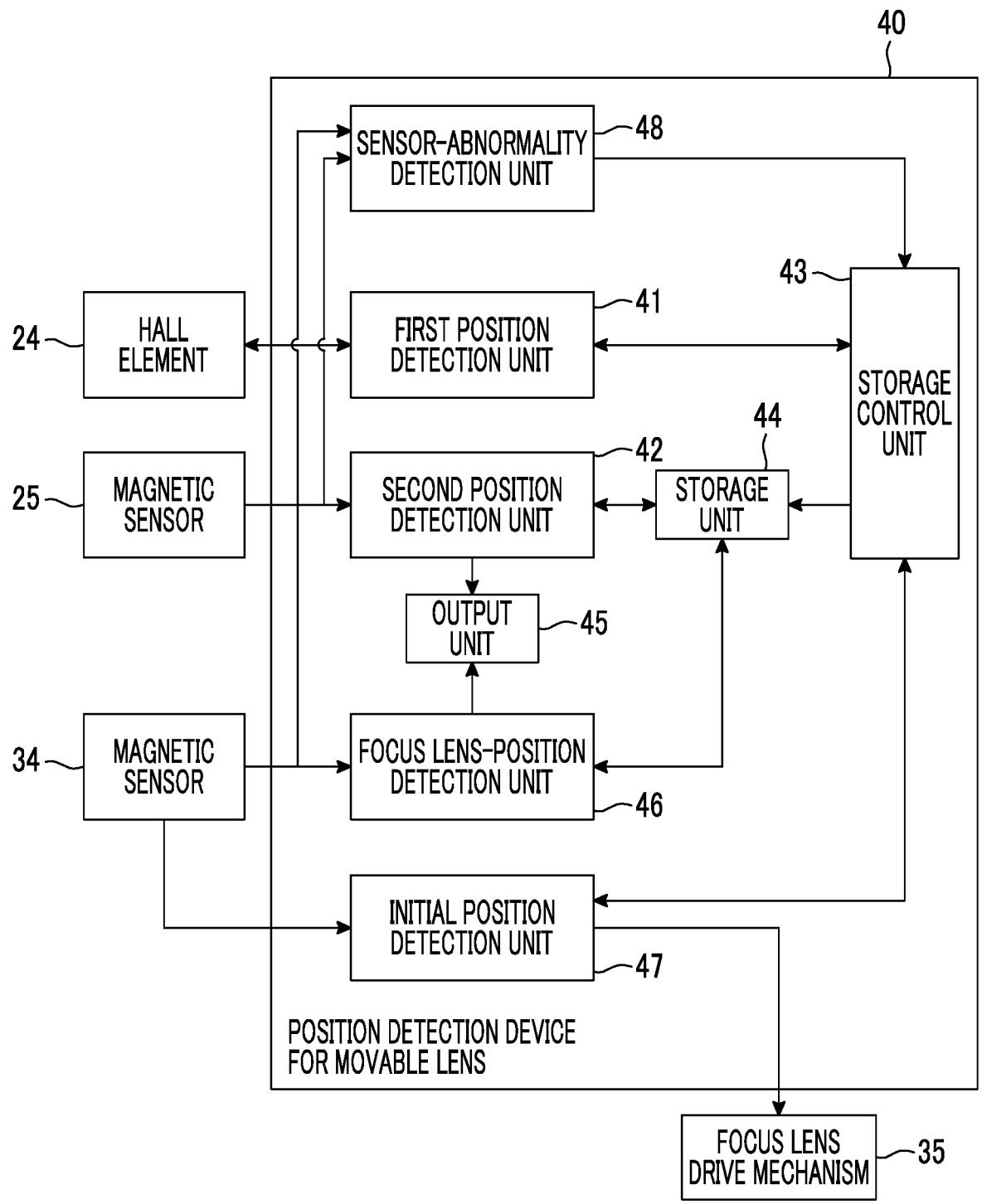
FIG. 4 is a block diagram showing the schematic configuration of a position detection device 40 for a movable lens that is mounted on the lens device 2 shown in FIG. 1.

FIG. 4 is a block diagram showing the schematic configuration of a position detection device 40 for a movable lens that is mounted on the lens device 2 shown in FIG. 1.

The position detection device 40 includes a first position detection unit 41, a second position detection unit 42, a storage control unit 43, a storage unit 44, an output unit 45, a focus lens-position detection unit 46, an initial position detection unit 47, and a sensor-abnormality detection unit 48. The storage unit 44 may be provided outside the position detection device 40.

The position detection device 40 includes a processor as a main component. The first position detection unit 41, the second position detection unit 42, the storage control unit 43, the output unit 45, the focus lens-position detection unit 46, the initial position detection unit 47, and the sensor-abnormality detection unit 48 are functional blocks that are formed in a case in which the processor executes a position detection program. The position detection program is stored in a read only memory (ROM) that is built in, for example, the position detection device 40. The ROM forms a non-transitory computer readable storage medium.

The first position detection unit 41 detects the first position of the zoom lens 21 in the direction of the optical axis on the basis of signals output from the Hall element 24, and inputs the detected first position to the storage control unit 43.

The first position detection unit 41 calculates an average value of a plurality of signals output from the Hall element 24, and detects the first position on the basis of the average value. The calculation of the average value is performed to level deviations in the output of the Hall element 24 and to improve the accuracy of detection of the first position.

The first position detection unit 41 performs the start control and the stop control of the Hall element 24 in accordance with an instruction of the storage control unit 43.

In a case in which the lens device 2 is started, the initial position detection unit 47 controls the focus lens drive mechanism 35, moves the focus lens 31 to one end of the movable range of the focus lens 31, and then moves the focus lens 31 to the other end of the movable range.

The initial position detection unit 47 detects the initial position of the focus lens 31 (the position of the focus lens 31 at the time of start of the lens device 2) on the basis of signals output from the magnetic sensor 34 during the movement of the focus lens 31, and inputs the detected initial position to the storage control unit 43.

For example, a case in which the movable range of the focus lens 31 is set to 50 cm and the initial position of the focus lens 31 is a position away from one end of the movable range by 10 cm is considered.

In this case, at the time where the focus lens 31 is moved to one end of the movable range, the initial position detection unit 47 can detect that a moving distance between the initial position of the focus lens 31 and one end of the movable range (a first moving distance) is 10 cm, by output signals of the magnetic sensor 34.

Further, in a case in which the focus lens 31 is moved to the other end from one end of the movable range, the initial position detection unit 47 can detect a moving distance between one end and the other end of the movable range (a second moving distance) by the output signals of the magnetic sensor 34. Accordingly, the initial position detection unit 47 can detect the initial position from a relationship between the first moving distance and the second moving distance.

The initial position detection unit 47 detects the initial position at the time of start of the lens device 2 and in a case in which a predetermined condition is satisfied, and does not operate in other cases.

The storage control unit 43 makes the first position detection unit 41 detect the first position and stores the first position in the storage unit 44 formed of a storage medium, such as a random access memory (RAM), at the time of start of the lens device 2 that is a timing determined in advance.

Further, after the storage control unit 43 stores the first position in the storage unit 44 at the time of start of the lens device 2, the storage control unit 43 updates the first position stored in the storage unit 44 in a case in which a predetermined condition is satisfied.

Further, the storage control unit 43 stores the initial position, which is detected by the initial position detection unit 47, in the storage unit 44.

The second position detection unit 42 detects the second position of the zoom lens 21 in the direction of the optical axis on the basis of signals output from the magnetic sensor 25 and the most recent first position stored in the storage unit 44.

Specifically, the second position detection unit 42 uses the most recent first position stored in the storage unit 44 as a reference position, calculates the moving distance of the zoom lens 21 from the reference position on the basis of signals output from the magnetic sensor 25, and detects a position, which is moved from the reference position by this moving distance, as a second position.

The focus lens-position detection unit 46 detects the position of the focus lens 31 on the basis of the most recent initial position stored in the storage unit 44 and signals output from the magnetic sensor 34.

Specifically, the focus lens-position detection unit 46 uses the most recent initial position stored in the storage unit 44 as a reference position, calculates the moving distance of the focus lens 31 from the reference position on the basis of signals output from the magnetic sensor 34, and detects a position, which is moved from the reference position by this moving distance, as the position of the focus lens 31.

The output unit 45 notifies a user of the current position information of the zoom lens 21 by outputting the second position, which is detected by the second position detection unit 42, to a display unit or the like of the lens device 2 as the current position information of the zoom lens 21 or outputs the second position to the imaging device 1.

The output unit 45 outputs the position of the focus lens 31, which is detected by the focus lens-position detection unit 46, to the display unit or the like of the lens device 2 as the current position information of the focus lens 31, or outputs the position of the focus lens 31 to the imaging device 1.

The sensor-abnormality detection unit 48 functions as a second sensor-state detection unit that detects whether the output signal of the magnetic sensor 25 is in a normal state or an abnormal state, and a third sensor-state detection unit that detects whether the output signal of the magnetic sensor 34 is in a normal state or an abnormal state.

The sensor-abnormality detection unit 48 generates a determination value that is used to determine the state of an output signal of the magnetic sensor 25 on the basis of output signals of the magnetic sensor 25, and detects whether the output signal of the magnetic sensor 25 is in an abnormal state or a normal state by the comparison between the determination value and an abnormality-determination threshold value.

Likewise, the sensor-abnormality detection unit 48 generates a determination value that is used to determine the state of an output signal of the magnetic sensor 34 on the basis of output signals of the magnetic sensor 34, and detects whether the output signal of the magnetic sensor 34 is in an abnormal state or a normal state by the comparison between the determination value and an abnormality-determination threshold value.

Figure 5:
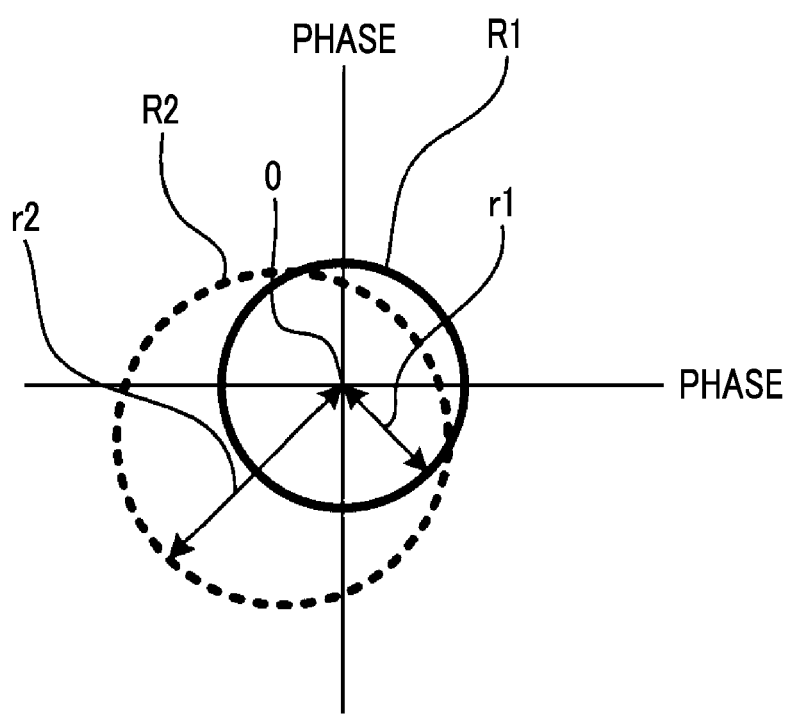
FIG. 5 is a diagram showing Lissajous curves based on output signals of magnetic sensors.

FIG. 5 is a diagram showing Lissajous curves based on the output signals of the magnetic sensors. A curve R1 shown in FIG. 5 is a Lissajous curve based on the output signal of the magnetic sensor 25 in a case in which the output signal of the magnetic sensor 25 is in a normal state. A curve R2 shown in FIG. 5 is a Lissajous curve based on the output signal of the magnetic sensor 25 in a case in which the output signal of the magnetic sensor 25 is in an abnormal state.

In a case in which the output signal of the magnetic sensor 25 is in a normal state, the curve R1 is a circle having a radius r1 and having a center at a point O, which is determined in advance, as shown in FIG. 5. In a case in which strong radio waves are applied to the magnetic sensor 25 from a radio or the like, the Lissajous curve becomes the curve R2 and the center and radius of the Lissajous curve are changed from those of the curve R1.

In a case in which a sine wave signal and a cosine wave signal, which are output from the magnetic sensor 25 at an arbitrary point of time, are denoted by Sa and Ca and central values (voltage levels where amplitudes are zero) of a sine wave signal and a cosine wave signal, which are output from the magnetic sensor 25, are denoted by SA and CA, the sensor-abnormality detection unit 48 calculates the square value of a distance between the point O of FIG. 5 and the Lissajous curve by performing the calculation of the following equation (1).

$$\text{Square value of distance}=(Sa-SA)^2+(Ca-CA)^2 \quad (1)$$

A difference between the square value of a distance, which is calculated by Equation (1), and the square value of the radius r1 is reduced in a case in which the output signal of the magnetic sensor 25 is in a normal state (a state in which the magnetic sensor 25 operates as designed), and is increased in a case in which the output signal of the magnetic sensor 25 is in an abnormal state. For example, in a state in which the Lissajous curve is similar to the curve R2, the square value of a distance r2 between the point O and the curve R2 is sufficiently larger than the square value of the radius r1.

The sensor-abnormality detection unit 48 calculates a difference between the square value of a distance, which is calculated by Equation (1), and the square value of the radius r1, which is determined in advance, as the determination value.

The sensor-abnormality detection unit 48 detects that the output signal of the magnetic sensor 25 is in an abnormal state in a case in which the determination value exceeds the abnormality-determination threshold value, and detects that the output signal of the magnetic sensor 25 is in a normal state in a case in which the determination value is equal to or smaller than the abnormality-determination threshold value.

Here, a difference between the square value of a distance, which is calculated by Equation (1), and the square value of the radius r1, which is determined in advance, has been described as the determination value, but the square value of a distance calculated by Equation (1) may be used as the determination value.

In this case, a predetermined range (for example, the range of 0.7 times to 1.3 times) of the square value of the radius r1, which is determined in advance, is referred to as the abnormality-determination threshold value.

The sensor-abnormality detection unit 48 determines that the output signal of the magnetic sensor 25 is in a normal state in a case in which the square value of a distance calculated by Equation (1) is in this predetermined range, and detects that the output signal of the magnetic sensor 25 is in an abnormal state in a case in which the square value of a distance calculated by Equation (1) is not in this predetermined range.

The sensor-abnormality detection unit 48 also detects whether the output signal of the magnetic sensor 34 is in an abnormal state or a normal state in the same manner as described above.

Figure 6:
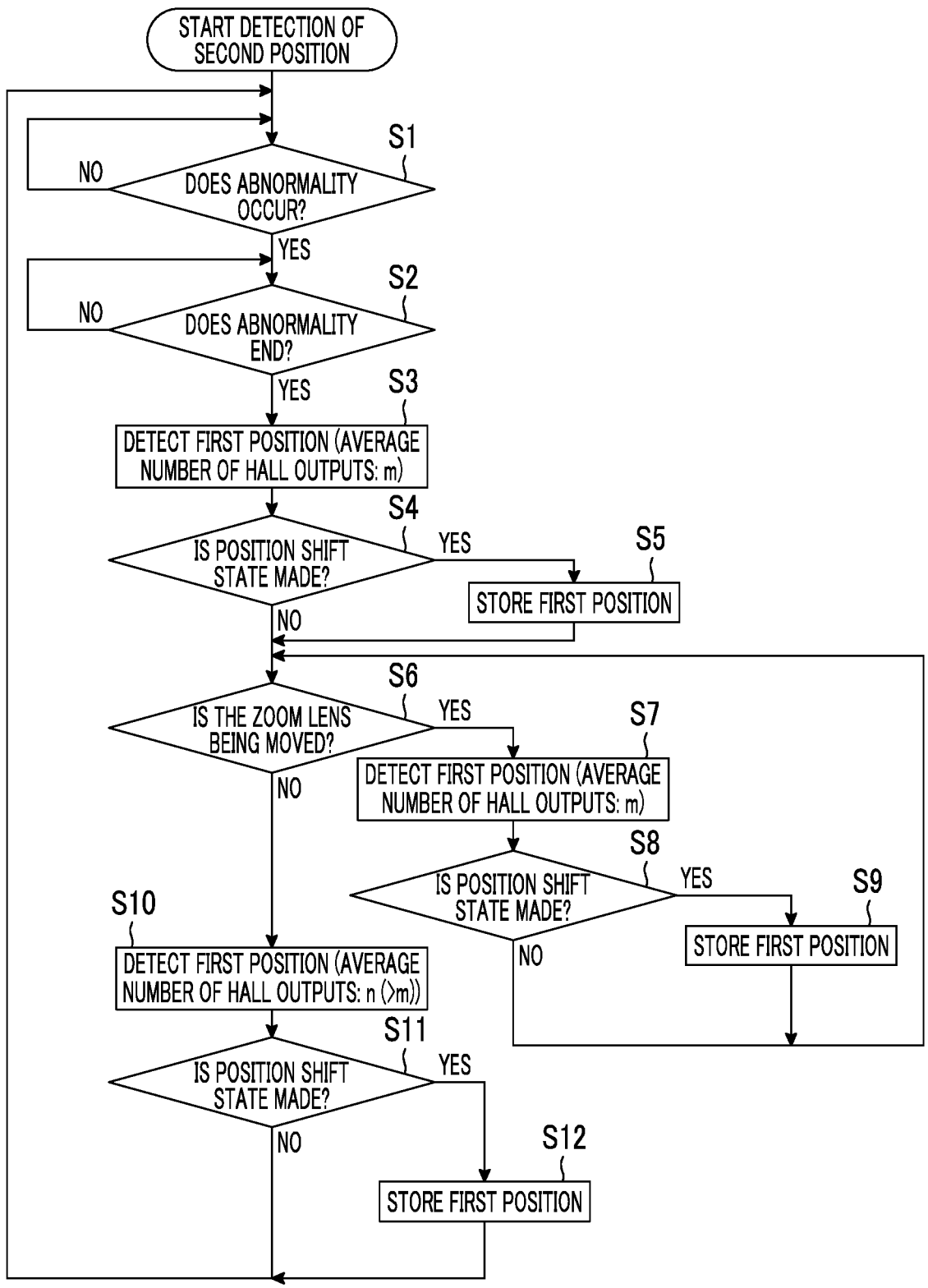
FIG. 6 is a flowchart illustrating an operation for detecting the position of a zoom lens 21 by the position detection device 40 shown in FIG. 4.

FIG. 6 is a flowchart illustrating an operation for detecting the position of the zoom lens 21 by the position detection device 40 shown in FIG. 4.

In a case in which the power source of the lens device 2 is turned on and the lens device 2 is started, the storage control unit 43 starts the Hall element 24 through the first position detection unit 41. Then, the first position detection unit 41 detects the first position of the zoom lens 21 on the basis of the signals output from the Hall element 24, and the power source of the Hall element 24 is turned off after the detection of the first position.

In a case in which the first position is detected, the storage control unit 43 stores the first position in the storage unit 44. In a case in which the first position is stored in the storage unit 44, the second position detection unit 42 detects the second position of the zoom lens 21 on the basis of the first position stored in the storage unit 44 and the signals output from the magnetic sensor 25. Then, in a case in which the signal output from the magnetic sensor 25 is changed, the second position is changed.

In a case in which the detection of the second position is started, the sensor-abnormality detection unit 48 calculates the determination value on the basis of the output signals of the magnetic sensor 25 and determines whether or not the calculated determination value exceeds the abnormality-determination threshold value (Step S1).

In a case in which the abnormality-determination threshold value is expressed by a numerical value range, a state in which the determination value is not in the numerical value range is treated as a state in which the determination value exceeds the abnormality-determination threshold value and a state in which the determination value is in the numerical value range is treated as a state in which the determination value is equal to or smaller than the abnormality-determination threshold value.

As a result of the determination, if the determination value is equal to or smaller than the abnormality-determination threshold value (NO in Step S1), the determination of Step S1 is repeated.

If the determination value exceeds the abnormality-determination threshold value (YES in Step S1), the sensor-abnormality detection unit 48 determines whether or not the determination value is equal to or smaller than the abnormality-determination threshold value (Step S2).

If the determination value exceeds the abnormality-determination threshold value (NO in Step S2), the processing of Step S2 is repeated. If the determination value is equal to or smaller than the abnormality-determination threshold value (YES in Step S2), the processing of Step S3 is performed.

In Step S3, the storage control unit 43 starts the Hall element 24 through the first position detection unit 41 and instructs the first position detection unit 41 to perform first detection. In this instruction, the average number of signals output from the Hall element 24 is set to m (m is a natural number of 2 or more).

In accordance with this instruction, the first position detection unit 41 calculates an average value of m signals output from the Hall element 24 and detects the first position of the zoom lens 21 on the basis of the average value (Step S3).

Next, the storage control unit 43 determines whether or not a position shift state in which a difference (absolute value) between the first position detected in Step S3 and the second position detected at the current point of time by the second position detection unit 42 is equal to or larger than a position threshold value TH1 is made (Step S4).

If the storage control unit 43 determines that the position shift state is made (YES in Step S4), the storage control unit 43 stores the first position, which is detected in Step S3, in the storage unit 44 (Step S5).

Since a first position is newly stored in the storage unit 44, a second position is detected on the basis of the most recent first position and the output signals of the magnetic sensor 25 by the second position detection unit 42.

If the storage control unit 43 determines that the position shift state is not made (NO in Step S4), the storage control unit 43 performs the processing of Step S6 without storing the first position, which is detected in Step S3, in the storage unit 44.

In Step S6, the storage control unit 43 determines whether or not the zoom lens 21 is being moved (Step S6).

In a case in which the moving distance of the zoom lens 21 (the amount of change in the second position, which is detected by the second position detection unit 42, per unit time) is smaller than a moving-distance threshold value, the storage control unit 43 determines that the zoom lens 21 is stopped. In a case in which the moving distance of the zoom lens 21 is equal to or larger than the moving-distance threshold value, the storage control unit 43 determines that the zoom lens 21 is being moved.

If the storage control unit 43 is in a first case in which the storage control unit 43 determines that the zoom lens 21 is being moved (YES in Step S6), the storage control unit 43 instructs the first position detection unit 41 to detect the first position. In this instruction, the average number of signals output from the Hall element 24 is set to m.

In accordance with this instruction, the first position detection unit 41 calculates an average value of m signals output from the Hall element 24 and detects the first position of the zoom lens 21 on the basis of the average value (Step S7).

Next, the storage control unit 43 determines whether or not a position shift state in which a difference (absolute value) between the first position detected in Step S7 and the second position detected at the current point of time by the second position detection unit 42 is equal to or larger than the position threshold value TH1 is made (Step S8).

If the storage control unit 43 determines that the position shift state is made (YES in Step S8), the storage control unit 43 stores the first position, which is detected in Step S7, in the storage unit 44 (Step S9).

Since a first position is newly stored in the storage unit 44, a second position is detected on the basis of the most recent first position and the output signals of the magnetic sensor 25 by the second position detection unit 42.

If the storage control unit 43 determines that the position shift state is not made (NO in Step S8), the storage control unit 43 returns to the processing of Step S6 without storing the first position, which is detected in Step S7, in the storage unit 44.

If the storage control unit 43 is in a first case in which the storage control unit 43 determines that the zoom lens 21 is not being moved (NO in Step S6), the storage control unit 43 instructs the first position detection unit 41 to detect the first position. In this instruction, the average number of signals output from the Hall element 24 is set to n (n is a natural number larger than m).

In accordance with this instruction, the first position detection unit 41 calculates an average value of n signals output from the Hall element 24 and detects the first position of the zoom lens 21 on the basis of the average value (Step S10).

Next, the storage control unit 43 determines whether or not a position shift state in which a difference (absolute value) between the first position detected in Step S10 and the second position detected at the current point of time by the second position detection unit 42 is equal to or larger than a position threshold value TH2 is made (Step S11). The position threshold value TH2 is a value smaller than the position threshold value TH1.

If the storage control unit 43 determines that the position shift state is made (YES in Step S11), the storage control unit 43 stores the first position, which is detected in Step S10, in the storage unit 44 (Step S12).

Since a first position is newly stored in the storage unit 44, a second position is detected on the basis of the most recent first position and the output signals of the magnetic sensor 25 by the second position detection unit 42.

If the storage control unit 43 determines that the position shift state is not made (NO in Step S11), the storage control unit 43 turns the power source of the Hall element 24 off without storing the first position, which is detected in Step S10, in the storage unit 44. After that, processing returns to Step S1.

According to the position detection device 40, as described above, in an abnormality-recovery state of the magnetic sensor 25 in which the output signal of the magnetic sensor 25 enters an abnormal state and then returns to a normal state, the Hall element 24 is started and the first position is detected by the first position detection unit 41.

Further, in the case of the position shift state in which a difference between the detected first position and the second position detected by the second position detection unit 42 is equal to or larger than the position threshold value TH1, the first position stored in the storage unit 44 is updated with new information.

Since the Hall element 24 is started and the first position detection unit 41 detects the first position in the abnormality-recovery state in this way, the first position stored in the storage unit 44 can be updated. For this reason, an error of the second position of the zoom lens 21, which is caused by the occurrence of abnormality on the output signal of the magnetic sensor 25, can be corrected and can return to a correct value.

Accordingly, since the highly accurate detection of the position of the zoom lens 21 can be continued even in a case in which abnormality occurs on the output of the magnetic sensor 25 due to a strong electric field or the like, a user can continue intended imaging.

Further, after the position detection device 40 performs the determination of whether or not the position shift state is made in Step S4 of FIG. 6, the position detection device 40 further performs the determination of whether or not the position shift state is made at least once.

Since the determination of whether or not the position shift state is made is performed at least twice in this way, it is possible to flexibly respond to a change in a situation in the abnormality-recovery state and to improve the accuracy of detection of the second position.

Specifically, if the zoom lens 21 is moved after the determination of Step S4, determination is made again in Step S8 and the first position is updated as necessary.

Since the first position stored in the storage unit 44 can be updated during the movement of the zoom lens 21 in this way, the accuracy of detection of the second position of the zoom lens 21 can be improved even in a case in which the zoom lens 21 is moved.

Further, if the zoom lens 21 is stopped after the determination of Step S4, determination is made again in Step S11 and the first position is updated as necessary.

Since the first position stored in the storage unit 44 can be updated in a state in which the zoom lens 21 is stopped in this way, the accuracy of detection of the second position of the zoom lens 21 can be improved even in a case in which the zoom lens 21 is moved.

Further, in the position detection device 40, the position threshold value TH1 used in the determination of Step S8 is larger than the position threshold value TH2 used in the determination of Step S11. For this reason, even though a difference between the first and second positions in Step S8 has the same value as that in Step S11, the storage control unit 43 is not likely to determine that the position shift state is made in Step S8.

That is, since the first position stored in the storage unit 44 is not likely to be updated during the movement of the zoom lens 21 in comparison with that during the stop of the zoom lens 21, the variation of the second position during a zoom operation can be suppressed. As a result, the quality of an image to be taken during a zoom operation can be improved.

On the other hand, since the first position stored in the storage unit 44 is likely to be updated in Step S11, the accuracy of detection of the second position can be improved.

Further, in the position detection device 40, the number (m in the above description) of output signals of the magnetic sensor 25 from which the average value is calculated, which is used to detect the first position in Step S3, is smaller than the number (n in the above description) of output signals of the magnetic sensor 25 from which the average value is calculated, which is used to detect the first position in Step S10.

It is possible to make processing speed and the accuracy of detection be compatible with each other by reducing the average number in Step S3 to give priority to processing speed and increasing the average number in Step S10 to give priority to the accuracy of detection of the second position in this way.

According to the position detection device 40, since the Hall element 24 of which the power consumption is larger than the power consumption of the magnetic sensor 25 is started only at the time of start of the lens device 2 and in the abnormality-recovery state, it is possible to improve the accuracy of detection of the second position while reducing power consumption.

The determination of Step S4 may be omitted in the flowchart of FIG. 6 so that the processing of Step S5 is performed after Step S3. In this case, the processing load of the position detection device 40 can be reduced.

Likewise, Step S8 may be omitted so that Step S9 is performed after Step S7. Likewise, Step S11 may be omitted so that Step S12 is performed after Step S10.

Further, the n and the m may be set as the same value, and the position threshold values TH1 and TH2 may be set as the same value.

Figure 7:
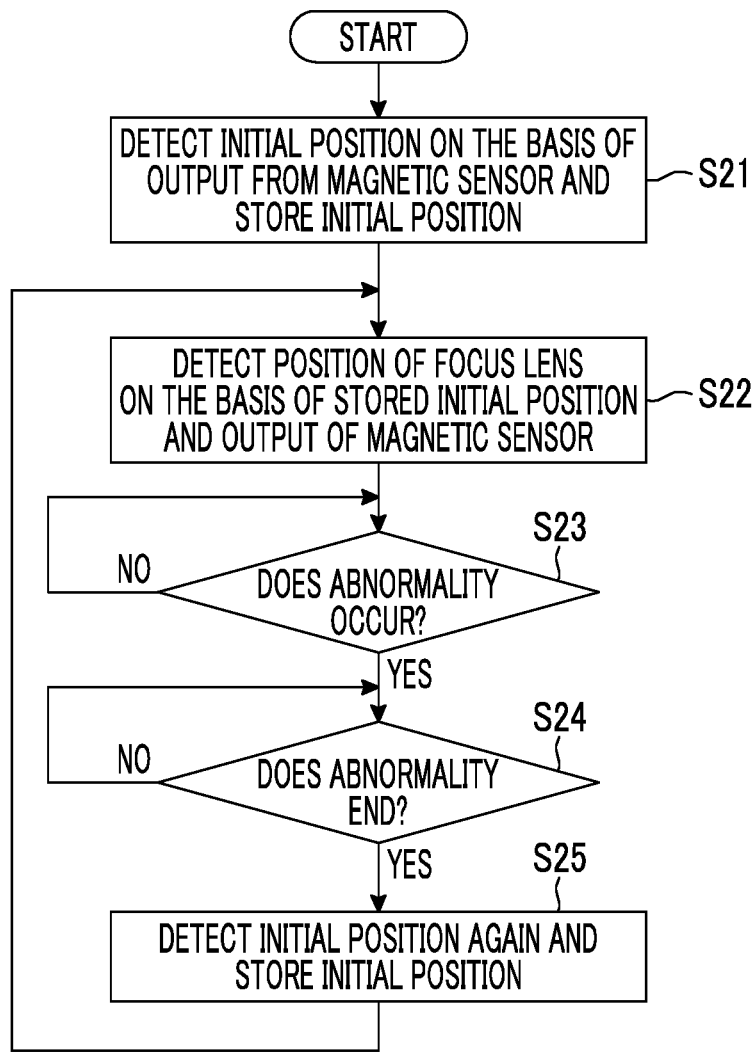
FIG. 7 is a flowchart illustrating an operation for detecting the position of a focus lens 31 by the position detection device 40 shown in FIG. 4.

FIG. 7 is a flowchart illustrating an operation for detecting the position of the focus lens 31 by the position detection device 40 shown in FIG. 4.

In a case in which the power source of the lens device 2 is turned on and the lens device 2 is started, the initial position detection unit 47 controls the focus lens drive mechanism 35, moves the focus lens 31 to one end of the movable range from the current position, and then moves the focus lens 31 to the other end from one end of the movable range.

The initial position detection unit 47 detects the initial position of the focus lens 31 on the basis of signals output from the magnetic sensor 34 during the movement of the focus lens 31. The detected initial position is stored in the storage unit 44 by the storage control unit 43 (Step S21).

In a case in which the initial position is stored in the storage unit 44, the focus lens-position detection unit 46 detects the position of the focus lens 31 on the basis of the initial position stored in the storage unit 44 and signals output from the magnetic sensor 34 (Step S22). Then, in a case in which the signal output from the magnetic sensor 34 is changed, the position of the focus lens 31 to be detected is changed.

In a case in which the detection of the position of the focus lens 31 is started, the sensor-abnormality detection unit 48 calculates the determination value on the basis of the output signals of the magnetic sensor 34 and determines whether or not the calculated determination value exceeds the abnormality-determination threshold value (Step S23). If the determination value is equal to or smaller than the abnormality-determination threshold value (NO in Step S23), the determination of Step S23 is repeated.

If the determination value exceeds the abnormality-determination threshold value (YES in Step S23), the sensor-abnormality detection unit 48 determines whether or not the determination value is equal to or smaller than the abnormality-determination threshold value (Step S24).

If the determination value exceeds the abnormality-determination threshold value (NO in Step S24), the processing of Step S24 is repeated. If the determination value is equal to or smaller than the abnormality-determination threshold value (YES in Step S24), the processing of Step S25 is performed.

In Step S25, the initial position detection unit 47 controls the focus lens drive mechanism 35, moves the focus lens 31 to one end of the movable range from the current position, and then moves the focus lens 31 to the other end from one end of the movable range.

The initial position detection unit 47 detects the initial position of the focus lens 31 again on the basis of signals output from the magnetic sensor 34 during the movement of the focus lens 31. The detected initial position is stored in the storage unit 44 by the storage control unit 43. Processing returns to Step S22 after Step S25.

According to the position detection device 40, as described above, in an abnormality-recovery state of the magnetic sensor 34 in which the output signal of the magnetic sensor 34 enters an abnormal state and then returns to a normal state, the initial position of the focus lens 31 is detected again and the initial position stored in the storage unit 44 is updated. Then, the position of the focus lens is detected on the basis of the updated initial position and output signals of the magnetic sensor 34 by the focus lens-position detection unit 46.

Since the initial position is detected again and is updated in the abnormality-recovery state in this way, a position detection error of the focus lens 31, which is caused by the occurrence of abnormality on the output signal of the magnetic sensor 34, can be corrected and can return to a correct value.

Accordingly, since the highly accurate detection of the position of the focus lens 31 can be performed even in a case in which abnormality occurs on the output of the magnetic sensor 34 due to a strong electric field or the like, a user can continue intended imaging.

The sensor-abnormality detection unit 48, which has been described above, detects whether each of the magnetic sensors 25 and 34 is in an abnormal state or a normal state by the comparison between the determination value and the abnormality-determination threshold value.

In order to ensure appropriate detection accuracy with respect to an individual difference of the lens device 2, values, which are experimentally obtained from every lens device 2, may be stored in an internal memory of the position detection device as the abnormality-determination threshold value.

For example, in a process for manufacturing the lens device 2, the square value of the radius of a Lissajous curve based on signals output from the magnetic sensor 25 and the square value of the radius of a Lissajous curve based on signals output from the magnetic sensor 34 are calculated in a first state in which the lens device 2 is under an environment where radio waves are not applied to the magnetic sensors 25 and 34.

After that, the square value of the radius of a Lissajous curve based on signals output from the magnetic sensor 25 and the square value of the radius of a Lissajous curve based on signals output from the magnetic sensor 34 are calculated in a second state in which already-known radio waves are applied to the magnetic sensors 25 and 34.

Further, an abnormality-determination threshold value is determined from the square value that is obtained from the respective magnetic sensors 25 and 34 in the first state and the square value that is obtained from the respective magnetic sensors 25 and 34 in the second state, and the determined abnormality-determination threshold value is stored in the internal memory. In this case, the detection of the abnormal state of the magnetic sensor can be accurately performed even in a case in which the degree of influence caused by the radio waves varies in each lens device 2.

The abnormality-determination threshold value may be stored in the lens device 2 as a fixed value that is determined in advance, but the sensor-abnormality detection unit 48 may have a function to generate an abnormality-determination threshold value on the basis of the output signals of the magnetic sensor 25 and the output signals of the magnetic sensor 34. In this case, the sensor-abnormality detection unit 48 functions as an abnormality-determination-threshold-value generation unit.

Specifically, the sensor-abnormality detection unit 48 acquires sine wave signals and cosine wave signals, which are output from the magnetic sensor 25, corresponding to at least one cycle during the start of the lens device 2.

The sensor-abnormality detection unit 48 determines that the output signal of the magnetic sensor 25 is in a normal state in a case in which the deviation of the square values of Equation (1) of all phases of one cycle is equal to or smaller than a predetermined value, and calculates an average value of the square values in this normal state.

Further, the sensor-abnormality detection unit 48 stores a value, which is the sum of the calculated average value and a predetermined value of 1 or less, or the range of ±a predetermined percentage of the calculated average value in the internal memory as an abnormality-determination threshold value.

The amplitudes of a sine wave signal and a cosine wave signal, which are output from the magnetic sensor 25, vary according to an individual difference of the magnetic sensor. For this reason, the sensor-abnormality detection unit 48 sets the predetermined value and the value of the predetermined percentage to values corresponding to the amplitudes of the sine wave signal and the cosine wave signal that are output from the magnetic sensor 25 in the normal state.

Since an abnormality-determination threshold value considering an individual difference of the magnetic sensor can be set in this case, the detection of an abnormal state can be accurately performed. Only the magnetic sensor 25 has been described here, but it is preferable that the sensor-abnormality detection unit 48 also generates an abnormality-determination threshold value in regard to the magnetic sensor 34.

The sensor-abnormality detection unit 48 may have a function to correct the abnormality-determination threshold value, which is stored in the internal memory, in order to further improve the accuracy of the abnormality-determination threshold value that is generated in this way.

For example, the sensor-abnormality detection unit 48 corrects the abnormality-determination threshold value, which is stored in the internal memory, on the basis of a difference between the first position that is detected first in the abnormality-recovery state of the magnetic sensor 25 by the first position detection unit 41 and the second position that is detected by the second position detection unit 42 immediately before the abnormality-recovery state.

In a case in which a difference between the first position detected in Step S3 and the second position detected by the second position detection unit 42 immediately before the determination of "YES" is made in Step S2 is small in the flowchart of FIG. 6, there is a high possibility that abnormality does not occur on the output of the magnetic sensor 25. That is, this means that the abnormality-determination threshold value is a value where the state of the output signal of the magnetic sensor 25 is likely to be determined as an abnormal state.

Accordingly, the sensor-abnormality detection unit 48 determines whether or not a difference between the first position detected in Step S3 and the second position detected by the second position detection unit 42 immediately before the determination of "YES" is made in Step S2 is equal to or small than a threshold value.

If an abnormality-determination threshold value is one numerical value in a case in which the difference is equal to or smaller than the threshold value, the sensor-abnormality detection unit 48 stores a value, which is increased (for example, 1.1 times) from the abnormality-determination threshold value, in the internal memory as a corrected abnormality-determination threshold value.

In a case in which the abnormality-determination threshold value is expressed by a numerical value range, the sensor-abnormality detection unit 48 stores a value, which is obtained by multiplying the upper limit of the numerical value range by, for example, 1.1, and a value, which is obtained by multiplying the lower limit thereof by, for example, 0.9, as a corrected abnormality-determination threshold value.

Since the abnormality-determination threshold value is corrected in this way, it is possible to prevent an operation, which is subsequent to Step S1 shown in FIG. 6, from being excessively performed. Accordingly, it is possible to improve the processing efficiency of the position detection device 40.

"Immediately before the abnormality-recovery state" means an arbitrary timing in a period between the point of time where the sensor-abnormality detection unit 48 detects that the output signal of the magnetic sensor is an abnormal state and the point of time where the sensor-abnormality detection unit 48 detects that the output signal of the magnetic sensor is a normal state (excluding the latter point of time).

Further, in another correction method, the sensor-abnormality detection unit 48 generates an abnormality-determination threshold value by the above-mentioned method, generates a temporary abnormality-determination threshold value, which is reduced from the generated abnormality-determination threshold value, and stores the temporary abnormality-determination threshold value in the internal memory.

In a case in which the abnormality-determination threshold value is expressed by one numerical value, the temporary abnormality-determination threshold value is a value that is reduced from the numerical value. In a case in which the abnormality-determination threshold value is expressed by a numerical value range, the temporary abnormality-determination threshold value is in a range between a value that is increased from the lower limit of the numerical value range and a value that is reduced from the upper limit of the numerical value range.

The sensor-abnormality detection unit 48 calculates a determination value on the basis of the output signals of the magnetic sensor 25, and determines whether or not the calculated determination value exceeds the temporary abnormality-determination threshold value and is equal to or smaller than the abnormality-determination threshold value.

The fact that the determination value exceeds the temporary abnormality-determination threshold value means that the determination value is not in a numerical value range in a case in which the temporary abnormality-determination threshold value is expressed by the numerical value range. The fact that the determination value is equal to or smaller than the abnormality-determination threshold value means that the determination value is in a numerical value range in a case in which the abnormality-determination threshold value is expressed by the numerical value range.

In a case in which the sensor-abnormality detection unit 48 determines that the calculated determination value exceeds the temporary abnormality-determination threshold value and is equal to or smaller than the abnormality-determination threshold value, the sensor-abnormality detection unit 48 calculates a difference between the most recent two second positions detected by the second position detection unit 42 as a variation of the second position.

Then, in a case in which this variation exceeds a variation threshold value, the sensor-abnormality detection unit 48 deletes the abnormality-determination threshold value of the internal memory and sets the temporary abnormality-determination threshold value as an abnormality-determination threshold value.

In a case in which the variation of the second position is equal to or smaller than the variation threshold value in a state in which the sensor-abnormality detection unit 48 determines that the calculated determination value exceeds the temporary abnormality-determination threshold value and is equal to or smaller than the abnormality-determination threshold value, the sensor-abnormality detection unit 48 makes the abnormality-determination threshold value of the internal memory be effective as it is.

A state in which it is detected that the output signal of the magnetic sensor 25 is in a normal state although the variation of the second position exceeds the variation threshold value means that the abnormality-determination threshold value is a value where the state of the output signal of the magnetic sensor 25 is likely to be determined as a normal state.

For this reason, in a case in which the abnormality-determination threshold value is replaced with the temporary abnormality-determination threshold value in such a state, an abnormal state can be accurately detected. Accordingly, the accuracy of detection of the second position can be improved.

A method of correcting an abnormality-determination threshold value, which is used to detect the abnormal state of the output signal of the magnetic sensor 25, has been described in the above description, but a method of correcting an abnormality-determination threshold value, which is used to detect the abnormal state of the output signal of the magnetic sensor 34, will be described below.

The sensor-abnormality detection unit 48 corrects the abnormality-determination threshold value, which is stored in the internal memory, on the basis of a difference between the initial position that is detected first in the abnormality-recovery state of the magnetic sensor 34 by the initial position detection unit 47 and the position of the focus lens that is detected by the focus lens-position detection unit 46 immediately before the abnormality-recovery state of the magnetic sensor 34.

In a case in which a difference between the initial position detected in Step S25 and the position of the focus lens detected by the focus lens-position detection unit 46 immediately before the determination of "YES" is made in Step S24 is small in the flowchart of FIG. 7, there is a high possibility that abnormality does not occur on the output of the magnetic sensor 34. That is, this means that the abnormality-determination threshold value is a value where the state of the output signal of the magnetic sensor 34 is likely to be determined as an abnormal state.

Accordingly, the sensor-abnormality detection unit 48 determines whether or not a difference between the initial position detected in Step S25 and the position of the focus lens detected immediately before the determination of "YES" is made in Step S24 is equal to or small than a threshold value.

If an abnormality-determination threshold value is one numerical value in a case in which the difference is equal to or smaller than the threshold value, the sensor-abnormality detection unit 48 stores a value, which is increased (for example, 1.1 times) from the abnormality-determination threshold value, in the internal memory as a corrected abnormality-determination threshold value.

In a case in which the abnormality-determination threshold value is expressed by a numerical value range, the sensor-abnormality detection unit 48 stores a value, which is obtained by multiplying the upper limit of the numerical value range by, for example, 1.1, and a value, which is obtained by multiplying the lower limit thereof by, for example, 0.9, as a corrected abnormality-determination threshold value.

Since the abnormality-determination threshold value is corrected in this way, it is possible to prevent an operation, which is subsequent to Step S24 shown in FIG. 7, from being excessively performed. Accordingly, it is possible to improve the processing efficiency of the position detection device 40.

"Immediately before the abnormality-recovery state of the magnetic sensor 34" means an arbitrary timing in a period between the point of time where the sensor-abnormality detection unit 48 detects that the output signal of the magnetic sensor 34 is an abnormal state and the point of time where the sensor-abnormality detection unit 48 detects that the output signal of the magnetic sensor 34 is a normal state (excluding the latter point of time).

In another correction method, the sensor-abnormality detection unit 48 generates an abnormality-determination threshold value by the above-mentioned method, generates a temporary abnormality-determination threshold value, which is reduced from the generated abnormality-determination threshold value, and stores the temporary abnormality-determination threshold value in the internal memory.

In a case in which the abnormality-determination threshold value is expressed by one numerical value, the temporary abnormality-determination threshold value is a value that is reduced from this numerical value. In a case in which the abnormality-determination threshold value is expressed by a numerical value range, the temporary abnormality-determination threshold value is in a range between a value that is reduced from the lower limit of the numerical value range and a value that is reduced from the upper limit of the numerical value range.

The sensor-abnormality detection unit 48 calculates a determination value on the basis of the output signals of the magnetic sensor 34, and determines whether or not the calculated determination value exceeds the temporary abnormality-determination threshold value and is equal to or smaller than the abnormality-determination threshold value.

In a case in which the sensor-abnormality detection unit 48 determines that the calculated determination value exceeds the temporary abnormality-determination threshold value and is equal to or smaller than the abnormality-determination threshold value, the sensor-abnormality detection unit 48 calculates a difference between the most recent two positions of the focus lens detected by the focus lens-position detection unit 46 as a variation of the position of the focus lens.

Then, in a case in which this variation exceeds a variation threshold value, the sensor-abnormality detection unit 48 deletes the abnormality-determination threshold value of the internal memory and sets the temporary abnormality-determination threshold value as an abnormality-determination threshold value.

In a case in which the variation of the position of the focus lens is equal to or smaller than the variation threshold value in a state in which the sensor-abnormality detection unit 48 determines that the calculated determination value exceeds the temporary abnormality-determination threshold value and is equal to or smaller than the abnormality-determination threshold value, the sensor-abnormality detection unit 48 makes the abnormality-determination threshold value of the internal memory be effective just as it is.

A state in which it is detected that the output signal of the magnetic sensor 34 is in a normal state although the variation of the position of the focus lens exceeds the variation threshold value means that the abnormality-determination threshold value is a value where the state of the output signal of the magnetic sensor 34 is likely to be determined as a normal state.

For this reason, in a case in which the abnormality-determination threshold value is replaced with the temporary abnormality-determination threshold value in such a state, an abnormal state can be accurately detected. Accordingly, the accuracy of detection of the position of the focus lens can be improved.

The lens device 2 may be adapted so that the zoom lens 21 is changed to the focus lens 31 and the focus lens 31 is changed to the zoom lens 21. Further, the lens device 2 may be adapted to detect the position of the focus lens 31 by continuing to use the initial position, which is detected at the time of start of the lens device 2 by the initial position detection unit 47, during the start of the lens device 2.

Furthermore, the lens device 2 has been described as a lens device for business use, but can also be applied as a lens device that is to be detachably mounted on a digital camera serving as an imaging device.

The followings will be disclosed in this specification as described above.

The disclosed position detection device for a movable lens comprises a first position detection unit that detects a first position of a movable lens in a direction of an optical axis on the basis of a signal output from a first sensor outputting a signal corresponding to the position of the movable lens in the direction of the optical axis, a storage control unit that stores the first position detected by the first position detection unit in a storage unit, a second position detection unit that detects a second position of the movable lens in the direction of the optical axis on the basis of a signal output from a second sensor outputting a signal corresponding to a moving distance of the movable lens in the direction of the optical axis and the most recent first position stored in the storage unit, an output unit that outputs the second position detected by the second position detection unit, and a second sensor-state detection unit that detects whether the output signal of the second sensor is in a normal state or an abnormal state. The first position detection unit detects the first position on the basis of a signal output from the first sensor at a timing determined in advance, and detects the first position again on the basis of a signal output from the first sensor in an abnormality-recovery state in which the second sensor-state detection unit detects that the output signal of the second sensor is in the abnormal state and then detects that the output signal of the second sensor is in the normal state after the first position is stored in the storage unit.

In the disclosed position detection device for a movable lens, the storage control unit determines whether or not a position shift state in which a difference between the first position detected by the first position detection unit and the second position detected by the second position detection unit is equal to or larger than a position threshold value is made in the abnormality-recovery state, and stores the first position detected by the first position detection unit in the storage unit in a case in which the position shift state is made.

In the disclosed position detection device for a movable lens, after the storage control unit performs determination of whether or not the position shift state is made in the abnormality-recovery state, the storage control unit performs the determination at least once.

In the disclosed position detection device for a movable lens, the movable lens includes a zoom lens, and the storage control unit determines whether or not the position shift state is made in the abnormality-recovery state, repeatedly performs the determination until the moving distance of the zoom lens is smaller than a moving-distance threshold value in a first case in which the moving distance of the zoom lens is equal to or larger than the moving-distance threshold value, and performs the determination once in a second case in which the moving distance of the zoom lens is smaller than the moving-distance threshold value.

In the disclosed position detection device for a movable lens, the position threshold value, which is used for the determination to be performed in the first case, is larger than the position threshold value that is used for the determination to be performed in the second case.

In the disclosed position detection device for a movable lens, the first position detection unit detects the first position on the basis of an average value of signals output from the first sensor, and the number of signals output from the first sensor from which the average value is calculated in a case in which the first position used in the determination to be performed in the second case is to be detected is larger than the number of signals output from the first sensor from which the average value is calculated in a case in which the first position used in the determination to be performed first in the abnormality-recovery state is to be detected.

In the disclosed position detection device for a movable lens, the second sensor-state detection unit generates a determination value that is used to determine the state of the output signal of the second sensor on the basis of the output signal of the second sensor, and detects whether the output signal of the second sensor is in the abnormal state or the normal state by comparison between the determination value and an abnormality-determination threshold value. The position detection device for a movable lens further comprises an abnormality-determination-threshold-value generation unit that generates the abnormality-determination threshold value on the basis of the output signal of the second sensor.

In the disclosed position detection device for a movable lens, the second sensor-state detection unit corrects the abnormality-determination threshold value on the basis of a difference between the position detected by the first position detection unit in the abnormality-recovery state and the second position detected by the second position detection unit immediately before the abnormality-recovery state.

In the disclosed position detection device for a movable lens, the second sensor-state detection unit sets a temporary abnormality-determination threshold value as the abnormality-determination threshold value in a case in which a variation of the second position detected by the second position detection unit exceeds a variation threshold value in a state in which the determination value exceeds the temporary abnormality-determination threshold value smaller than the abnormality-determination threshold value and is equal to or smaller than the abnormality-determination threshold value.

In the disclosed position detection device for a movable lens, the movable lens is a zoom lens. The position detection device for a movable lens further comprises: a third sensor-state detection unit that detects whether an output signal of a third sensor outputting a signal corresponding to a moving distance of a focus lens, which is a movable lens different from the zoom lens, is in the normal state or the abnormal state; an initial position detection unit that detects an initial position of the focus lens on the basis of a signal output from the third sensor while moving the focus lens to one end of a movable range of the focus lens from a current position and moving the focus lens to the other end of the movable range from the one end of the movable range; a focus lens-position detection unit that detects the position of the focus lens on the basis of the initial position detected by the initial position detection unit and a signal output from the third sensor. After the initial position detection unit detects the initial position at a timing determined in advance, the initial position detection unit detects the initial position again in a third sensor abnormality-recovery state in which the third sensor-state detection unit detects that the output signal of the third sensor is in the abnormal state and then detects that the output signal of the third sensor is in the normal state.

In the disclosed position detection device for a movable lens, the third sensor-state detection unit generates a determination value that is used to determine the state of the output signal of the third sensor on the basis of the output signal of the third sensor, and detects whether the output signal of the third sensor is in the abnormal state or the normal state by comparison between the determination value and an abnormality-determination threshold value. The position detection device for a movable lens further comprises an abnormality-determination-threshold-value generation unit that generates the abnormality-determination threshold value on the basis of the output signal of the third sensor.

In the disclosed position detection device for a movable lens, the third sensor-state detection unit corrects the abnormality-determination threshold value on the basis of a difference between the initial position detected by the initial position detection unit in the third sensor abnormality-recovery state and the position detected by the focus lens-position detection unit immediately before the third sensor abnormality-recovery state.

In the disclosed position detection device for a movable lens, the third sensor-state detection unit sets a temporary abnormality-determination threshold value as the abnormality-determination threshold value in a case in which a variation of the position of the focus lens detected by the focus lens-position detection unit exceeds a variation threshold value in a state in which the determination value exceeds the temporary abnormality-determination threshold value smaller than the abnormality-determination threshold value and is equal to or smaller than the abnormality-determination threshold value.

In the disclosed position detection device for a movable lens, the second sensor is a sensor including a magnetoresistive element.

In the disclosed position detection device for a movable lens, each of the second sensor and the third sensor is a sensor including a magnetoresistive element.

A disclosed lens device of the invention comprises the position detection device and a movable lens of which the position is to be detected by the position detection device.

A disclosed imaging device comprises the position detection device and an imaging element that images a subject through a movable lens of which the position is to be detected by the position detection device.

A disclosed position detection method for a movable lens comprises a first position detection step of detecting a first position of a movable lens in a direction of an optical axis on the basis of a signal output from a first sensor outputting a signal corresponding to the position of the movable lens in the direction of the optical axis, a storage control step of storing the first position detected in the first position detection step in a storage unit, a second position detection step of detecting a second position of the movable lens in the direction of the optical axis on the basis of a signal output from a second sensor outputting a signal corresponding to a moving distance of the movable lens in the direction of the optical axis and the most recent first position stored in the storage unit, an output step of outputting the second position detected in the second position detection step, and a second sensor-state detection step of detecting whether the output signal of the second sensor is in a normal state or an abnormal state. In the first position detection step, the first position is detected on the basis of a signal output from the first sensor at a timing determined in advance, and the first position is detected again on the basis of a signal output from the first sensor in an abnormality-recovery state in which in the second sensor-state detection step, it is detected that the output signal of the second sensor is in the abnormal state and it is then detected that the output signal of the second sensor is the a normal state after the first position is stored in the storage unit.

In the disclosed position detection method for a movable lens, in the storage control step, it is determined whether or not a position shift state in which a difference between the first position detected in the first position detection step and the second position detected in the second position detection step is equal to or larger than a position threshold value is made in the abnormality-recovery state, and the first position detected in the first position detection step is stored in the storage unit in a case in which the position shift state is made.

In the disclosed position detection method for a movable lens, in the storage control step, after determination of whether or not the position shift state is made in the abnormality-recovery state is performed, the determination is performed at least once.

In the disclosed position detection method for a movable lens, the movable lens includes a zoom lens. In the storage control step, determination of whether or not the position shift state is made in the abnormality-recovery state is performed, the determination is repeatedly performed until the moving distance of the zoom lens is smaller than a moving-distance threshold value in a first case in which the moving distance of the zoom lens is equal to or larger than the moving-distance threshold value, and the determination is performed once in a second case in which the moving distance of the zoom lens is smaller than the moving-distance threshold value.

In the disclosed position detection method for a movable lens, the position threshold value, which is used for the determination to be performed in the first case, is larger than the position threshold value that is used for the determination to be performed in the second case.

In the disclosed position detection method for a movable lens, in the first position detection step, the first position is detected on the basis of an average value of signals output from the first sensor, and the number of signals output from the first sensor from which the average value is calculated in a case in which the first position used in the determination to be performed in the second case is to be detected is larger than the number of signals output from the first sensor from which the average value is calculated in a case in which the first position used in the determination to be performed first in the abnormality-recovery state is to be detected.

In the disclosed position detection method for a movable lens, in the second sensor-state detection step, a determination value that is used to determine the state of the output signal of the second sensor is generated on the basis of the output signal of the second sensor, and whether the output signal of the second sensor is in the abnormal state or the normal state is detected by comparison between the determination value and an abnormality-determination threshold value. The position detection method for a movable lens further comprises an abnormality-determination-threshold-value generation step of generating the abnormality-determination threshold value on the basis of the output signal of the second sensor.

In the disclosed position detection method for a movable lens, in the second sensor-state detection step, the abnormality-determination threshold value is corrected on the basis of a difference between the first position detected in the initial position detection step in the abnormality-recovery state and the second position detected in the second position detection step immediately before the abnormality-recovery state.

In the disclosed position detection method for a movable lens, in the second sensor-state detection step, a temporary abnormality-determination threshold value is set as the abnormality-determination threshold value in a case in which a variation of the second position detected in the second position detection step exceeds a variation threshold value in a state in which the determination value exceeds the temporary abnormality-determination threshold value smaller than the abnormality-determination threshold value and is equal to or smaller than the abnormality-determination threshold value.

In the disclosed position detection method for a movable lens, the movable lens is a zoom lens. The position detection method for a movable lens further comprises: a third sensor-state detection step of detecting whether an output signal of a third sensor outputting a signal corresponding to a moving distance of a focus lens, which is a movable lens different from the zoom lens, is in the normal state or the abnormal state; an initial position detection step of detecting an initial position of the focus lens on the basis of a signal output from the third sensor while moving the focus lens to one end of a movable range of the focus lens from a current position and moving the focus lens to the other end of the movable range from the one end of the movable range; a focus lens-position detection step of detecting the position of the focus lens on the basis of the initial position detected in the initial position detection step and a signal output from the third sensor. In the initial position detection step, after the initial position is detected at a timing determined in advance, the initial position is detected again in a third sensor abnormality-recovery state in which in the third sensor-state detection step, it is detected that the output signal of the third sensor is in the abnormal state and it is then detected that the output signal of the third sensor is in the normal state.

In the disclosed position detection method for a movable lens, in the third sensor-state detection step, a determination value that is used to determine the state of the output signal of the third sensor is generated on the basis of the output signal of the third sensor, and whether the output signal of the third sensor is in the abnormal state or the normal state is detected by comparison between the determination value and an abnormality-determination threshold value. The position detection method for a movable lens further comprises an abnormality-determination-threshold-value generation step of generating the abnormality-determination threshold value on the basis of the output signal of the third sensor.

In the disclosed position detection method for a movable lens, in the third sensor-state detection step, the abnormality-determination threshold value is corrected on the basis of a difference between the initial position detected in the initial position detection step in the third sensor abnormality-recovery state and the position detected by the focus lens-position detection step immediately before the third sensor abnormality-recovery state.

In the disclosed position detection method for a movable lens, in the third sensor-state detection step, a temporary abnormality-determination threshold value is set as the abnormality-determination threshold value in a case in which a variation of the position of the focus lens detected in the focus lens-position detection step exceeds a variation threshold value in a state in which the determination value exceeds the temporary abnormality-determination threshold value smaller than the abnormality-determination threshold value and is equal to or smaller than the abnormality-determination threshold value.

In the disclosed position detection method for a movable lens, the second sensor is a sensor including a magnetoresistive element.

In the disclosed position detection method for a movable lens, each of the second sensor and the third sensor is a sensor including a magnetoresistive element.

A position detection program for a movable lens of the invention allows a computer to execute a first position detection step of detecting a first position of a movable lens in a direction of an optical axis on the basis of a signal output from a first sensor outputting a signal corresponding to the position of the movable lens in the direction of the optical axis, a storage control step of storing the first position detected in the first position detection step in a storage unit, a second position detection step of detecting a second position of the movable lens in the direction of the optical axis on the basis of a signal output from a second sensor outputting a signal corresponding to a moving distance of the movable lens in the direction of the optical axis and the most recent first position stored in the storage unit, an output step of outputting the second position detected in the second position detection step, and a second sensor-state detection step of detecting whether the output signal of the second sensor is in a normal state or an abnormal state. In the first position detection step, the first position is detected on the basis of a signal output from the first sensor at a timing determined in advance, and the first position is detected again on the basis of a signal output from the first sensor in an abnormality-recovery state in which in the second sensor-state detection step, it is detected that the output signal of the second sensor is in the abnormal state and it is then detected that the output signal of the second sensor is in the normal state after the first position is stored in the storage unit.

Particularly, the invention is applied to a lens device for business use, and is highly convenient and effective.

The invention has been described above using a specific embodiment. However, the invention is not limited to this embodiment, and can have various modifications without departing from the scope of the invention.

This application is based on Japanese Patent Application (JP2015-194233A) filed Sep. 30, 2015, the content of which is incorporated herein by reference.

EXPLANATION OF REFERENCES

1: imaging device
2: lens device
3: mount portion
5: photographer
6: finder device
7: right hand
8: focus ring
9: zoom ring
10: housing
10a, 10b: rotating cylinder
11: iris ring
20: magnetic recording member
21: zoom lens
22: zoom lens holder
23: magnet
24: Hall element
25: magnetic sensor
31: focus lens
32: focus lens holder
33: magnetic recording member
34: magnetic sensor
35: focus lens drive mechanism
40: position detection device
41: first position detection unit
42: second position detection unit
43: storage control unit
44: storage unit
45: output unit
46: focus lens-position detection unit
47: initial position detection unit
48: sensor-abnormality detection unit
O: point
r1: radius
r2: distance
R1, R2: curve

What is claimed is:

1. A position detection device for a movable lens, comprising:
   a first position detection unit that detects a first position of a movable lens in a direction of an optical axis based on a signal output from a first sensor outputting a signal corresponding to a position of the movable lens in the direction of the optical axis;
   a storage control unit that stores the first position detected by the first position detection unit in a storage unit;
   a second position detection unit that detects a second position of the movable lens in the direction of the optical axis based on a signal output from a second sensor outputting a signal corresponding to a moving distance of the movable lens in the direction of the optical axis and the most recent first position stored in the storage unit;
   an output unit that outputs the second position detected by the second position detection unit; and
   a second sensor-state detection unit that detects whether the output signal of the second sensor is in a normal state or an abnormal state,
   wherein the first position detection unit detects the first position based on a signal output from the first sensor at a timing determined in advance, and detects the first position again based on a signal output from the first sensor in an abnormality-recovery state in which the second sensor-state detection unit detects that the output signal of the second sensor is in the abnormal state and then detects that the output signal of the second sensor is in the normal state after the first position is stored in the storage unit, and
   the storage control unit determines whether or not a position shift state in which a difference between the first position detected by the first position detection unit and the second position detected by the second position detection unit is equal to or larger than a position threshold value is made in the abnormality-recovery state, and stores the first position detected by the first position detection unit in the storage unit in a case in which the position shift state is made.

2. The position detection device for a movable lens according to claim 1,
   wherein after the storage control unit performs determination of whether or not the position shift state is made in the abnormality-recovery state, the storage control unit performs the determination at least once.

3. The position detection device for a movable lens according to claim 2,
   wherein the movable lens comprises a zoom lens, and
   the storage control unit determines whether or not the position shift state is made in the abnormality-recovery state, repeatedly performs the determination until the moving distance of the zoom lens is smaller than a moving-distance threshold value in a first case in which the moving distance of the zoom lens is equal to or larger than the moving-distance threshold value, and performs the determination once in a second case in which the moving distance of the zoom lens is smaller than the moving-distance threshold value.

4. The position detection device for a movable lens according to claim 3,
wherein the position threshold value, which is used for the determination to be performed in the first case, is larger than the position threshold value that is used for the determination to be performed in the second case.

5. The position detection device for a movable lens according to claim 4,
wherein the first position detection unit detects the first position based on an average value of signals output from the first sensor, and a number of signals output from the first sensor from which the average value is calculated in a case in which the first position used in the determination to be performed in the second case is to be detected is larger than a number of signals output from the first sensor from which the average value is calculated in a case in which the first position used in the determination to be performed first in the abnormality-recovery state is to be detected.

6. The position detection device for a movable lens according to claim 1,
wherein the second sensor-state detection unit generates a determination value that is used to determine a state of the output signal of the second sensor based on the output signal of the second sensor, and detects whether the output signal of the second sensor is in the abnormal state or the normal state by comparison between the determination value and an abnormality-determination threshold value,
the position detection device further comprising:
an abnormality-determination-threshold-value generation unit that generates the abnormality-determination threshold value based on the output signal of the second sensor.

7. The position detection device for a movable lens according to claim 6,
wherein the second sensor-state detection unit corrects the abnormality-determination threshold value based on a difference between the position detected by the first position detection unit in the abnormality-recovery state and the second position detected by the second position detection unit immediately before the abnormality-recovery state.

8. The position detection device for a movable lens according to claim 6,
wherein the second sensor-state detection unit sets a temporary abnormality-determination threshold value as the abnormality-determination threshold value in a case in which a variation of the second position detected by the second position detection unit exceeds a variation threshold value in a state in which the determination value exceeds the temporary abnormality-determination threshold value smaller than the abnormality-determination threshold value and is equal to or smaller than the abnormality-determination threshold value.

9. The position detection device for a movable lens according to claim 1,
wherein the movable lens is a zoom lens, and
the position detection device further comprises:
a third sensor-state detection unit that detects whether an output signal of a third sensor outputting a signal corresponding to a moving distance of a focus lens, which is a movable lens different from the zoom lens, is in the normal state or the abnormal state;
an initial position detection unit that detects an initial position of the focus lens based on a signal output from the third sensor while moving the focus lens to one end of a movable range of the focus lens from a current position and moving the focus lens to other end of the movable range from the one end of the movable range; and
a focus lens-position detection unit that detects the position of the focus lens based on the initial position detected by the initial position detection unit and a signal output from the third sensor,
wherein after the initial position detection unit detects the initial position at a timing determined in advance, the initial position detection unit detects the initial position again in a third sensor abnormality-recovery state in which the third sensor-state detection unit detects that the output signal of the third sensor is in the abnormal state and then detects that the output signal of the third sensor is in the normal state.

10. The position detection device for a movable lens according to claim 9,
wherein the third sensor-state detection unit generates a determination value that is used to determine a state of the output signal of the third sensor based on the output signal of the third sensor, and detects whether the output signal of the third sensor is in the abnormal state or the normal state by comparison between the determination value and an abnormality-determination threshold value,
the position detection device further comprising:
an abnormality-determination-threshold-value generation unit that generates the abnormality-determination threshold value based on the output signal of the third sensor.

11. The position detection device for a movable lens according to claim 10,
wherein the third sensor-state detection unit corrects the abnormality-determination threshold value based on a difference between the initial position detected by the initial position detection unit in the third sensor abnormality-recovery state and the position detected by the focus lens-position detection unit immediately before the third sensor abnormality-recovery state.

12. The position detection device for a movable lens according to claim 10,
wherein the third sensor-state detection unit sets a temporary abnormality-determination threshold value as the abnormality-determination threshold value in a case in which a variation of the position of the focus lens detected by the focus lens-position detection unit exceeds a variation threshold value in a state in which the determination value exceeds the temporary abnormality-determination threshold value smaller than the abnormality-determination threshold value and is equal to or smaller than the abnormality-determination threshold value.

13. The position detection device for a movable lens according to claim 1,
wherein the second sensor is a sensor comprising a magnetoresistive element.

14. The position detection device for a movable lens according to claim 9,
wherein each of the second sensor and the third sensor is a sensor comprising a magnetoresistive element.

15. A lens device comprising:
the position detection device for a movable lens according to claim 1; and
a movable lens of which a position is to be detected by the position detection device.

16. An imaging device comprising:
the position detection device for a movable lens according to claim 1; and
an imaging element that images a subject through a movable lens of which a position is to be detected by the position detection device.

17. A position detection method for a movable lens, comprising:
a first position detection step of detecting a first position of a movable lens in a direction of an optical axis based on a signal output from a first sensor outputting a signal corresponding to a position of the movable lens in the direction of the optical axis;
a storage control step of storing the first position detected in the first position detection step in a storage unit;
a second position detection step of detecting a second position of the movable lens in the direction of the optical axis based on a signal output from a second sensor outputting a signal corresponding to a moving distance of the movable lens in the direction of the optical axis and the most recent first position stored in the storage unit;
an output step of outputting the second position detected in the second position detection step; and
a second sensor-state detection step of detecting whether the output signal of the second sensor is in a normal state or an abnormal state,
wherein in the first position detection step, the first position is detected based on a signal output from the first sensor at a timing determined in advance, and the first position is detected again based on a signal output from the first sensor in an abnormality-recovery state in which in the second sensor-state detection step, it is detected that the output signal of the second sensor is in the abnormal state and it is then detected that the output signal of the second sensor is in the normal state after the first position is stored in the storage unit, and
in the storage control step, it is determined whether or not a position shift state in which a difference between the first position detected in the first position detection step and the second position detected in the second position detection step is equal to or larger than a position threshold value is made in the abnormality-recovery state, and the first position detected in the first position detection step is stored in the storage unit in a case in which the position shift state is made.

18. The position detection method for a movable lens according to claim 17,
wherein in the storage control step, after determination of whether or not the position shift state is made in the abnormality-recovery state is performed, the determination is performed at least once.

19. The position detection method for a movable lens according to claim 18,
wherein the movable lens comprises a zoom lens, and
in the storage control step, determination of whether or not the position shift state is made in the abnormality-recovery state is performed, the determination is repeatedly performed until the moving distance of the zoom lens is smaller than a moving-distance threshold value in a first case in which the moving distance of the zoom lens is equal to or larger than the moving-distance threshold value, and the determination is performed once in a second case in which the moving distance of the zoom lens is smaller than the moving-distance threshold value.

20. The position detection method for a movable lens according to claim 19,
wherein the position threshold value, which is used for the determination to be performed in the first case, is larger than the position threshold value that is used for the determination to be performed in the second case.

21. The position detection method for a movable lens according to claim 20,
wherein in the first position detection step, the first position is detected based on an average value of signals output from the first sensor, and a number of signals output from the first sensor from which the average value is calculated in a case in which the first position used in the determination to be performed in the second case is to be detected is larger than a number of signals output from the first sensor from which the average value is calculated in a case in which the first position used in the determination to be performed first in the abnormality-recovery state is to be detected.

22. The position detection method for a movable lens according to claim 17,
wherein in the second sensor-state detection step, a determination value that is used to determine a state of the output signal of the second sensor is generated based on the output signal of the second sensor, and whether the output signal of the second sensor is in the abnormal state or the normal state is detected by comparison between the determination value and an abnormality-determination threshold value,
the position detection method for a movable lens further comprising:
an abnormality-determination-threshold-value generation step of generating the abnormality-determination threshold value based on the output signal of the second sensor.

23. The position detection method for a movable lens according to claim 22,
wherein in the second sensor-state detection step, the abnormality-determination threshold value is corrected based on a difference between the first position detected in the initial position detection step in the abnormality-recovery state and the second position detected in the second position detection step immediately before the abnormality-recovery state.

24. The position detection method for a movable lens according to claim 22,
wherein in the second sensor-state detection step, a temporary abnormality-determination threshold value is set as the abnormality-determination threshold value in a case in which a variation of the second position detected in the second position detection step exceeds a variation threshold value in a state in which the determination value exceeds the temporary abnormality-determination threshold value smaller than the abnormality-determination threshold value and is equal to or smaller than the abnormality-determination threshold value.

25. The position detection method for a movable lens according to claim 17,
wherein the movable lens is a zoom lens, and
the position detection method further comprises:
a third sensor-state detection step of detecting whether an output signal of a third sensor outputting a signal corresponding to a moving distance of a focus lens, which is a movable lens different from the zoom lens, is in the normal state or the abnormal state;
an initial position detection step of detecting an initial position of the focus lens based on a signal output from the third sensor while moving the focus lens to one end of a movable range of the focus lens from a current position and moving the focus lens to other end of the movable range from the one end of the movable range; and
a focus lens-position detection step of detecting the position of the focus lens based on the initial position detected by the initial position detection step and a signal output from the third sensor,
wherein in the initial position detection step, after the initial position is detected at a timing determined in advance, the initial position is detected again in a third sensor abnormality-recovery state in which in the third sensor-state detection step, it is detected that the output signal of the third sensor is in the abnormal state and it is then detected that the output signal of the third sensor is in the normal state.

26. The position detection method for a movable lens according to claim 25,
wherein in the third sensor-state detection step, a determination value that is used to determine a state of the output signal of the third sensor is generated based on the output signal of the third sensor, and whether the output signal of the third sensor is in the abnormal state or the normal state is detected by comparison between the determination value and an abnormality-determination threshold value,
the position detection method for a movable lens further comprising:
an abnormality-determination-threshold-value generation step of generating the abnormality-determination threshold value based on the output signal of the third sensor.

27. The position detection method for a movable lens according to claim 26,
wherein in the third sensor-state detection step, the abnormality-determination threshold value is corrected based on a difference between the initial position detected in the initial position detection step in the third sensor abnormality-recovery state and the position detected in the focus lens-position detection step immediately before the third sensor abnormality-recovery state.

28. The position detection method for a movable lens according to claim 26,
wherein in the third sensor-state detection step, a temporary abnormality-determination threshold value is set as the abnormality-determination threshold value in a case in which a variation of the position of the focus lens detected in the focus lens-position detection step exceeds a variation threshold value in a state in which the determination value exceeds the temporary abnormality-determination threshold value smaller than the abnormality-determination threshold value and is equal to or smaller than the abnormality-determination threshold value.

29. The position detection method for a movable lens according to claim 17,
wherein the second sensor is a sensor comprising a magnetoresistive element.

30. The position detection method for a movable lens according to claim 25,
wherein each of the second sensor and the third sensor is a sensor comprising a magnetoresistive element.

31. A non-transitory computer readable medium storing a position detection program for a movable lens that allows a computer to execute steps, the steps comprising:
a first position detection step of detecting a first position of a movable lens in a direction of an optical axis based on a signal output from a first sensor outputting a signal corresponding to a position of the movable lens in the direction of the optical axis;
a storage control step of storing the first position detected in the first position detection step in a storage unit;
a second position detection step of detecting a second position of the movable lens in the direction of the optical axis based on a signal output from a second sensor outputting a signal corresponding to a moving distance of the movable lens in the direction of the optical axis and the most recent first position stored in the storage unit;
an output step of outputting the second position detected in the second position detection step; and
a second sensor-state detection step of detecting whether the output signal of the second sensor is in a normal state or an abnormal state,
wherein in the first position detection step, the first position is detected based on a signal output from the first sensor at a timing determined in advance, and the first position is detected again based on a signal output from the first sensor in an abnormality-recovery state in which in the second sensor-state detection step, it is detected that the output signal of the second sensor is in the abnormal state and it is then detected that the output signal of the second sensor is in the normal state after the first position is stored in the storage unit, and
in the storage control step, it is determined whether or not a position shift state in which a difference between the first position detected in the first position detection step and the second position detected in the second position detection step is equal to or larger than a position threshold value is made in the abnormality-recovery state, and the first position detected in the first position detection step is stored in the storage unit in a case in which the position shift state is made.

* * * * *